United States Patent [19]
Auzino et al.

[11] Patent Number: 5,960,296
[45] Date of Patent: *Sep. 28, 1999

[54] METHOD FOR ALIGNING THE DEVICE LAYERS IN A SEMICONDUCTOR DEVICE

[75] Inventors: Luigi Auzino, Sperone; Agostino Cangiano, Avezzano, both of Italy

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/769,247

[22] Filed: Dec. 18, 1996

[51] Int. Cl.⁶ .................................................. H01L 21/76
[52] U.S. Cl. ............................................................ 438/401
[58] Field of Search ................................ 437/8; 438/975, 438/401; 355/53

[56] References Cited

U.S. PATENT DOCUMENTS 5,532,091  7/1996  Mizutani .
5,604,354  2/1997  Lauverjat .................................... 355/53

FOREIGN PATENT DOCUMENTS 0 389 209   9/1990   European Pat. Off. .
44 14 369  10/1994   Germany .

Primary Examiner—Brian Dutton
Attorney, Agent, or Firm—William B. Kempler; Richard L. Donaldson

[57] ABSTRACT

This invention relates to method for forming a semiconductor device on a semiconductor wafer comprising the following steps:

forming a plurality of device layers each including a reference mark applied thereon;

forming a composite reference mark including one or more features from each of the reference marks applied on the layers which are to be aligned;

comparing the reference mark with the features of the marks applied on the or each layer to be aligned in order to identify when the alignment is attained; and forming a next device layer aligned with two or more of said plurality of device layers.

7 Claims, 3 Drawing Sheets

TRCH = LEVEL 1

F/P = LEVEL 2

GATE = LEVEL 3

TRCH PROCESS

STEPPER MARK

ALIGNMENT MARK

PROCESS

STEPPER MARK

ALIGNMENT MARK

METHOD FOR ALIGNING THE DEVICE LAYERS IN A SEMICONDUCTOR DEVICE

This invention, relates to improvements in or relating to semiconductor processing methods, in particular to a method for aligning a multi-layer device.

Semiconductor devices are typically made by building up a number of layers of conductor, semiconductor and insulator material using processing methods, such as photolithography. Typically each of the layers must be aligned with another layer to make up the semiconductor device. The requirement to align the layers is very important, since if the layers are mis-aligned the device is unlikely to work.

In current systems, the alignment occurs between one layer and the next one. A mark is applied during the processing stages of the first layer which is used to align the next layer. Should alignment of subsequent layers be required, it would be necessary to apply a new reference mark and then to align the subsequent layer with it.

In addition, in the manufacture of most semiconductor devices, there are usually a large number of devices on any single wafer. Since all the devices on any wafer are the identical, a mask for a given layer of the device is programmed for a single device and, therefore, the mask is exposed over the whole of the wafer by using a stepper machine. The stepper machine allows the mask for a single device to be reproduced over the whole surface of the wafer. The stepper device exposes the photoresist at the location of the first device and then 'steps' on to the next device and exposes it. This treatment is extended to the whole surface of the wafer. The stepper device can detect when it is in the correct position to expose the next device, by identifying a stepper or reference mark. The stepper mark is a mark which is exposed in the masking step preceding to the one which is currently being carried out.

The present system makes it very difficult to align one layer with more than one other layer, especially when the layers are not adjacent. In fact, in the latter case the failure rate of a process is typically fairly high and/or the processing steps are complicated and laborious. In addition, similar problems are encountered when the stepper device steps from one device to the next. The combination of the operations for aligning the layers and stepping from one device to the next in the production of a typical semiconductor device is thus fraught with problems, especially when there are more than two layers which need to be aligned with one another.

One object of the present invention is to provide a method and apparatus to overcome at least some of the disadvantages of the prior art.

According to one aspect of the present invention there is provided a method for forming a semiconductor device on a semiconductor wafer comprising:

forming a plurality of device layers each including a reference mark thereon;

forming a composite reference mark including one or more features from each of the marks of layers which are to be aligned;

comparing the reference mark with the mark features on the or each layer to be aligned in order to identify when the alignment is attained; and forming a next device layer aligned with two or more of said plurality of device layers.

This method has the advantage that it is possible to align each layer in a semiconductor device with all or any of the other layers. The reference marks used are of hybrid type and as such each layer requiring alignment includes at least a part of the hybrid reference mark.

Preferably the method further comprises forming part of a composite mark on each layer to be aligned.

Advantageously the method further comprises:

storing the composite reference mark in a memory;

identifying the reference marks on the layers to be aligned by means of a viewing means;

adjusting the position of processing machinery in dependence of said identification such that the next processing step can be carried out in the required position for alignment of the next layer with the or any one of other layers.

Reference will now be made, by way of exemplary preferred embodiment of this invention, to the accompanying drawings, wherein:

FIG. 1 illustrates and alignment tree for a memory device being made up of a number of layers. In the Figure, the layers are each represented by a number of letters:

MR2 represents a connection layer;

VIA represents a via formed in the next layer;

MR1 represents connection layer;

CT represents a contact layer;

BL represents a bit line layer;

BLCT represents a bit line contact;

GATE represents a gate layer;

F/P represents a field plate layer;

TRCH represents a trench layer for capacitors; and

MOAT represents an active area or moat layer.

Figure 1:
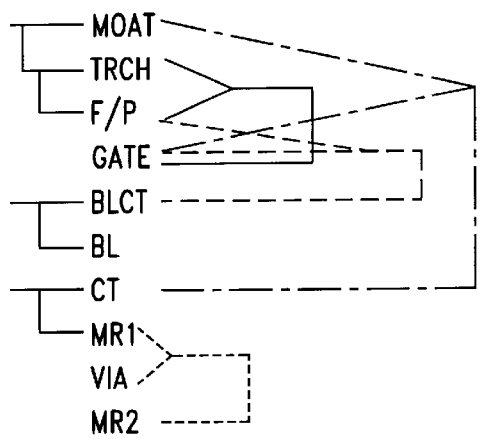
FIG. 1 is a diagram showing the layers making up a conventional semiconductor device.

In addition, FIG. 1 also shows a number of dotted lines, these lines represent the layers which are intended to be aligned with one another. For example, it can be seen that the contact layer (CT) needs to be aligned with both the gate and the moat layers and the bit line contact (BLCT) layer should be aligned with the gate and the field plate (F/P) layers. In different types of devices it is possible that different layers will need to be aligned, as it will be apparent to those skilled in the art.

Figure 2A:
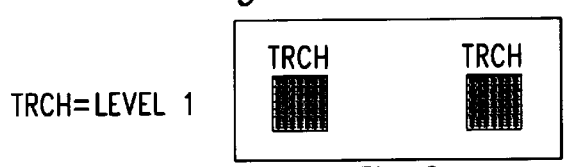
FIGS. 2a to 2d are diagrams showing the process for making a semiconductor device according to the present invention.
Figure 2B:
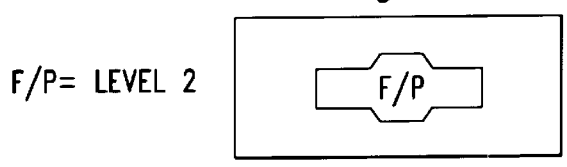
Figure 2C:
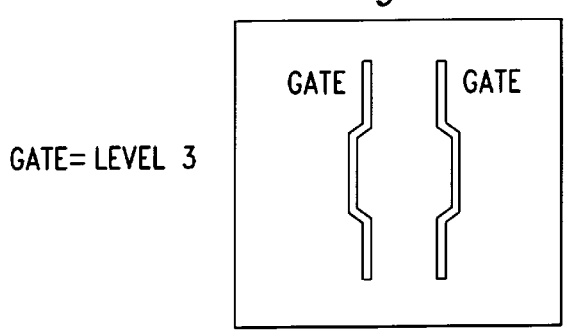
Figure 2D:
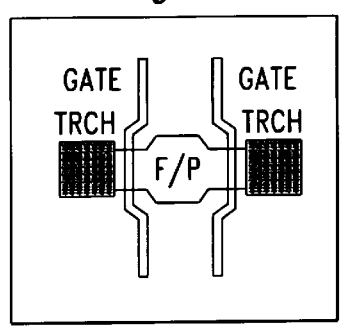

The general process steps of FIG. 2a–2c show the trench (TRCH), field plate (F/P) and gate (GATE) positions in three levels, 1, 2 and 3. In addition, the relative positions of each of these elements are shown superimposed upon one another in FIG. 2d. It is essential that the levels (or layers) be positioned such that the layers be aligned as it is shown in FIG. 2d.

Figure 3:
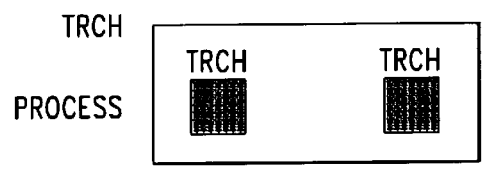
FIG. 3 is a diagram illustrating one of the steps of the process.
Figure 3:
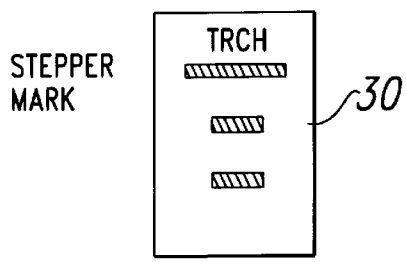
Figure 3:
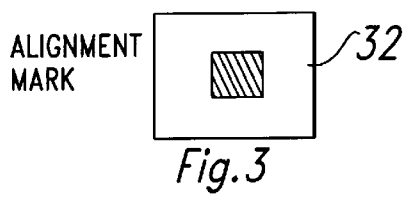

In FIG. 3, it can be seen that, when the trench layer is made, two reference marks are applied to this layer. One mark is the stepper mark (30) and the other one is the alignment mark (32). The stepper mark includes a number of strokes having a predetermined separation from one another and positioned at known orientations with respect to one another. The alignment mark is a cube having a known location and size. The two reference marks can be applied at any suitable location on the layer. Typically they are located near the edges of the layer so that they do not cover any one of the component parts of the device.

The marks are not limited to be as they are shown but they may be of other shapes and orientations, as long as they are known for a given layer.

Figure 4:
FIG. 4 is a diagram showing a second step of the process.
Figure 4:
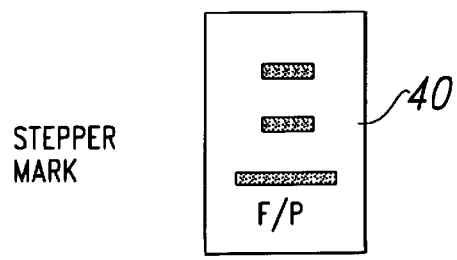
Figure 4:
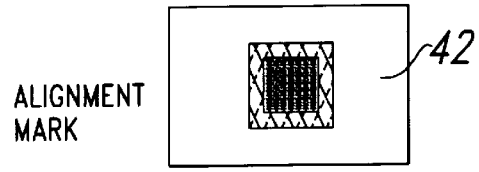

Referring to FIG. 4 the field plate treatment process is shown. In a similar manner to the trench treatment process above, two reference marks are applied during the production of the field plate layer. The first one is a stepper reference mark (40) and the second one is an alignment reference mark (42). The stepper mark includes a number of strokes which are positioned in different positions with respect to the trench stepper reference mark (30), but which can be combined with the reference mark (30) to allow the alignment of a third layer with both the trench and the field plate layers. The reference marks of more than one layer are combined to make a composite or hybrid stepper mark. Therefore, it is possible that two sets of stepper marks be applied to each layer. One set for alignment with single layers and another set for alignment with multiple layers where a composite or hybrid reference mark is used.

In the manufacturing process for each of the layers, a stepper machine (not shown) is used, which is capable of identifying the reference marks on the or each layer below the one which is currently being applied. By identifying the reference mark or marks, it is possible to accurately position the current layer with respect to one or more other layers. When one layer is aligned with one other layer, the stepper reference mark is identified by the stepper machine and compared with a stored reference mark to ensure that the layer is correctly and accurately aligned. In the case of an alignment operation with more than one layer, there is a composite reference which contains features of the stepper reference marks for each layer. The alignment is effected by ensuring that the composite reference mark is aligned with the features on all relevant underlying layers.

Figure 5:
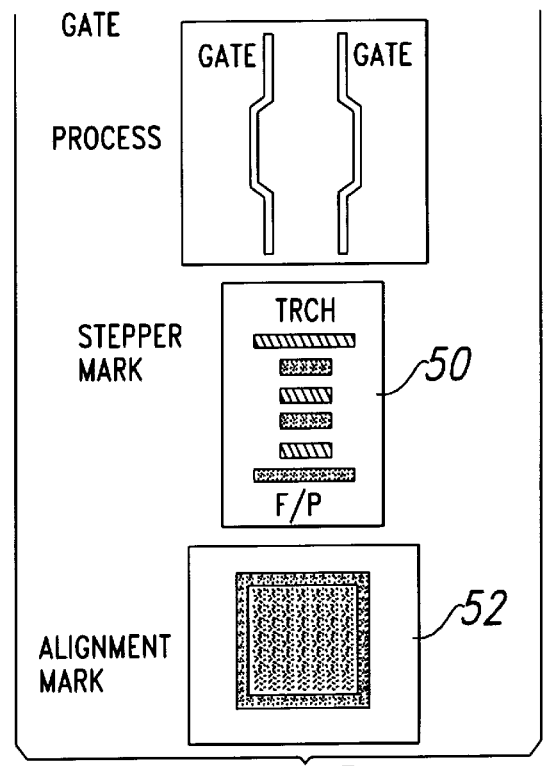
FIG. 5 is a diagram showing a third step of the process.

Referring to FIG. 5, the gate layer process is illustrated. Once again a stepper reference mark (50) and an alignment reference mark (52) are applied. The mark identifiable by the stepper treatment machine is a composite mark containing features extracted from the stepper marks of both the trench and the field plate layers.

Figure 6:
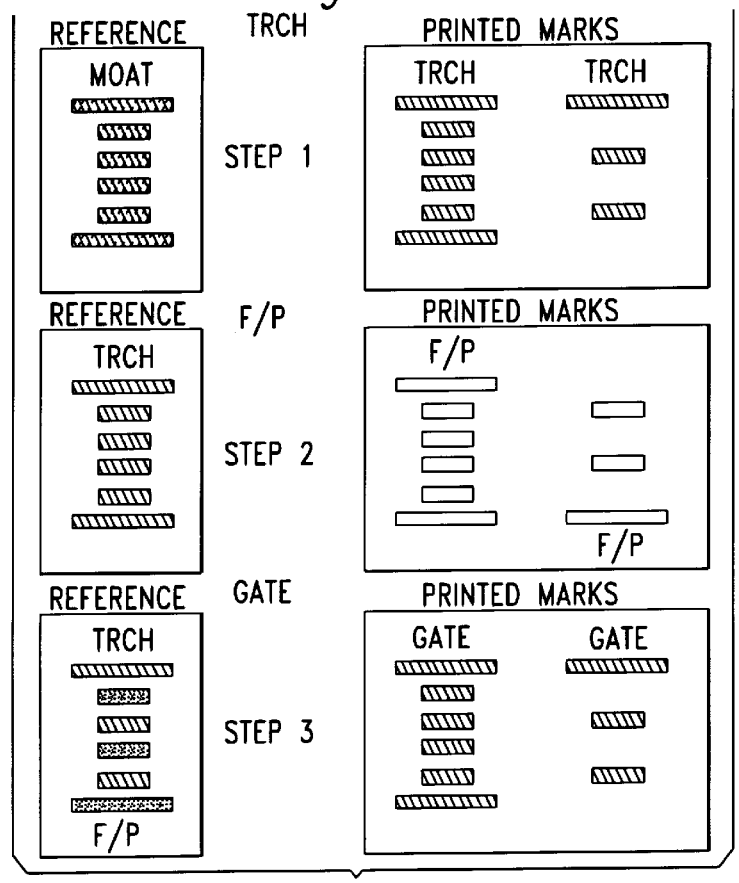
FIG. 6 is a diagram illustrating the stepping reference marks made on various layers of the device, for operation of the stepper machine.

Referring to FIG. 6, the stepper reference marks and the printed marks are shown for each process step. It can be seen that when step three is carried out, that is the process step involving the gate layer, the stepper reference mark is a composite mark made up of features of the marks on each of the trench and field plate layers. By using this technique for aligning a given layer with a composite stepper mark obtained from the reference marks of a number of different layers it is possible to improve the method for manufacturing a circuit.

As previously mentioned, each layer may additionally include an alignment mark, which may be used in the same way as the stepper marks and can assist in the alignment of different layers with each other. Typically the alignment marks are used in conjunction with an overlay machine (not shown) to ensure correct alignment of the layers.

Figure 7:
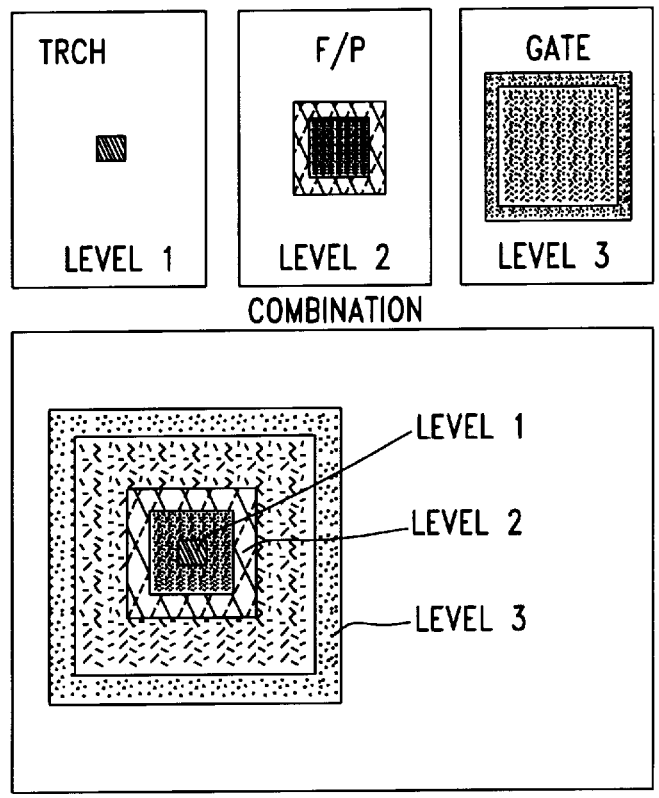
FIG. 7 is a diagram illustrating the alignment marks on the various layers.

FIG. 7 illustrates the alignment marks for each of the trench, field plate and gate layers and the combination mark produced when all the layer are accurately overlaid.

Figure 8:
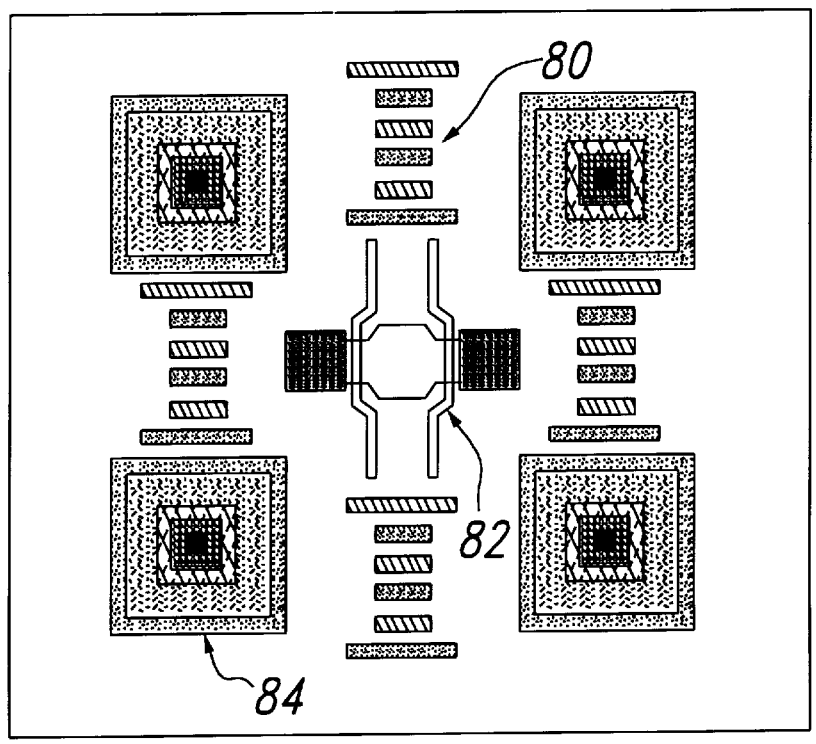
FIG. 8 is a diagram showing all the reference marks produced during the manufacturing process of the device.

In FIG. 8 the full set of reference marks are shown for the stepping and alignment or overlaying processes. In addition the final locations of the trench layer (80), the field plate layer (82) and the gate layer (84) can be seen.

In the illustrated example, the stepper reference marks are shown as a number of stripes having different positions and lengths. It will be understood that different types of marks could be used other than those shown. The main requirement is that the stepper machine can use the appropriate reference marks to enable recognition of the alignment and stepper marks as applied. It will be appreciated that a different mark will typically be used on each different layer and that composite or hybrid marks will be produced in dependence on the marks of the individual layer. Where there is the need that more than two layers be aligned, the stepper machine will include means for identifying the composite mark to allow alignment with all those layers to which alignment is required. The composite or hybrid mark could include features extracted from any number of underlying layers depending on which layers must be aligned.

What is claimed is:

1. A method of forming a semiconductor device on a semiconductor wafer comprising the steps of:

forming a first device layer including a first reference mark on said semiconductor wafer;

forming a second device layer including a second reference mark on said semiconductor wafer, said first and second reference marks forming a composite mark including one or more features from said first reference mark and one or more features from said second reference mark;

forming a third device layer aligned with said first and second device layers by means of said composite reference mark, whereby said first, second and third layers of said semiconductor device are aligned.

2. The method according to claim 1, further comprising forming a portion of said composite mark on each of the first and second layers to be aligned.

3. The method according to claim 1, further comprising the following steps:

storing the composite reference mark in a memory;

identifying the reference marks applied on the first and second device layers to be aligned by using a viewing means;

adjusting the position of a processing machine in dependence on said step of identifying, such that the next processing step be performed in the position required for alignment of the next layer with one or more of the layers of the semiconductor device.

4. The method according to claim 3, further comprising the step of comparing the reference marks comprises carrying out the step with an overlaying machine.

5. The method according to claim 1, comprising identifying the position of the composite mark so as to effect the alignment between the next layer and two or more of said first and second device layers.

6. A method according to claim 1, further comprising forming a plurality of semiconductor devices on said wafer and identifying the position of the composite mark so as to effect the alignment between the next layer and two or more of said first or second device layers for each of said plurality of semiconductor devices on the surface of the wafer.

7. The method according to claim 1, wherein the step of comparing the composite mark of the next device is performed by a stepper machine.

\* \* \* \* \*